United States Patent [19]

Bolliger et al.

[11] Patent Number: 5,537,332

[45] Date of Patent: Jul. 16, 1996

[54] STACK MACRO ORDER OPTIMIZING METHOD

[75] Inventors: Mark D. Bolliger, South Burlington; Bruce A. Kauffmann, Jericho, both of Vt.

[73] Assignee: International Business Machines Corporation, Armonk, N.Y.

[21] Appl. No.: 146,820

[22] Filed: Nov. 2, 1993

Related U.S. Application Data

[63] Continuation of Ser. No. 664,903, Mar. 5, 1991, abandoned.

[51] Int. Cl.$^6$ .................................................... G06F 17/50
[52] U.S. Cl. ........................................ 364/490; 364/489
[58] Field of Search ................................ 364/488, 489, 364/496, 491

[56] References Cited

U.S. PATENT DOCUMENTS

| | | | |
|---|---|---|---|
| 4,495,559 | 1/1985 | Gelatt, Jr. et al. | 364/491 |
| 4,630,219 | 12/1986 | DiGiacomo et al. | 364/488 |
| 4,701,860 | 10/1987 | Mader | 364/490 |
| 4,775,942 | 10/1988 | Ferrei et al. | 364/491 |
| 4,811,237 | 3/1989 | Putatunda et al. | 364/491 |
| 4,849,904 | 7/1989 | Aipperspach et al. | 364/489 |
| 4,855,958 | 8/1989 | Ikeda | 365/230.08 |
| 4,868,630 | 9/1989 | Tanizawa | 357/45 |
| 4,880,754 | 11/1989 | Correale | 437/51 |
| 4,972,324 | 11/1990 | Tanaka | 364/491 |
| 5,144,563 | 9/1992 | Date et al. | 364/491 |
| 5,371,684 | 12/1994 | Iadonato et al. | 364/491 |

OTHER PUBLICATIONS

Luk, "Multi–Terrain Partitioning and Floor–Planning For Data–Path Chip (Microprocessor) Layout," 26 ACM/IEEE Design Automation Conference, pp. 110–115, Jun. 1989.

Villarrubia et al., "IBM RISC Chip Design Methodology," IBM Advanced Workshop Division, ICCD–89 Conference, pp. 143–147.

"Multi–Stack Optimization for Data–Path Chip (Microprocessor) Layout" by W. K. Luk et al, 26th ACM/IEEE Design Automation Conference, Jun. 25–Jun. 29, 1989, pp. 03/23–08/23.

"Multi–Terrian Partitioning and Floor–Planning for Data–Path Chip (Microprocessor) Layout" by W. K. Luk et al, 26th ACM/IEEE Design Automation Conf. Jun. 1989, pp. 492–494.

"Multi–Stack Optimization for Data–Path Chip (Microprocessor) Layout" by Luk et al., IEEE 26th ACM/IEEE Design Automation Conference, Jun. 1989, pp. 110–114.

*Primary Examiner*—Vincent N. Trans
*Attorney, Agent, or Firm*—Heslin & Rothenberg

[57] ABSTRACT

An automated method for optimally ordering macros within a semiconductor chip data-path stack is disclosed. Each stack macro is assumed to have at least one predetermined bus connection with another macro in the stack. The ordering technique is based on minimizing for each macro in the stack the total number of stack macros passed by buses predeterminedly connected to that macro without making connection thereto. In addition, a macro group is formed of any subset of stack macros caught in a repeating loop. Each macro group contains at least two macros of the stack. Once defined, a macro group is treated as a single stack macro and optimization processing continues. Once the optimal location of all macros is identified, then any formed macro group is expanded and the optimal location of each macro within the group itself is identified. Specific details of the method are provided herein.

17 Claims, 7 Drawing Sheets fig. 1 fig. 2 fig. 3 fig. 4a fig. 4b fig. 5a fig. 5b fig. 5c

| (BUS #) | 1 | 2 | 3 | 4 | 5 | 6 | 7 | 8 |
|---|---|---|---|---|---|---|---|---|
| MACRO B | * |   | * |   |   |   |   |   |
| MACRO C | | |   | | |   | * |   | * |   |
| MACRO A | | | * | * | * | | |   | * |   |
| MACRO D | | |   | | | | |   | * |   |   |
| MACRO E | * |   | | |   | | | * | | |   |   |
| MACRO F | | | * |   | | |   | | |   | * |
| MACRO G | * |   |   | * |   | * |   | * |

\* CONNECTION TO THE MACRO
| NO CONNECTION TO THE MACRO

STACK MACRO ORDER OPTIMIZING METHOD

This is a Request for filing a continuation application under 37 CFR 1.62 of prior application Ser. No. 07/664,903, filed on Mar. 5, 1991 entitled STACK MACRO ORDER OPTIMIZING METHOD.

BACKGROUND OF THE INVENTION

1. Technical Field

This invention relates in general to semiconductor chip design techniques, and more particularly, to techniques for optimizing the physical order of macros within a vertical or horizontal data-path stack to be incorporated in a semiconductor chip.

2. Description of the Prior Art

Data-path chips (e.g., microprocessors) are implemented using a combination of data-path logic, control logic and memory arrays. Data-path logic is conventionally laid out in the form of bit stacks, see, e.g., J. Crawford, "Architecture of the Intel 80386," Proceedings IEEE ICCD, pp. 154–160, October 1986; and Dupont et al., "ROMP/MMU Circuit Technology and Chip Design," IBM RT Personal Computer Technology, SA23-1057, pp. 66–71, 1986. A bit-stack (or stack) is made up of data-path macros, such as registers, adders, shifters, multiplexers, buffers, etc. The data-path macros are stacked up vertically (or horizontally) and wired almost exclusively with vertical (horizontal) wires or buses. (In the optimizing technique described herein, an assumption is made that a vertical stack is to be ordered. However, the inventive technique is equally applicable to horizontal data-path stacks.)

Data flow information is processed along the bit-aligned data-path pipelines. The operation of the data-path macros is controlled by the control logic (or random logic) implemented in the form of standard cells. Large memory arrays (cache, register file) and special purpose, predesigned macros are also used as required. A data-path chip is typically made up of a mixture of different types of objects (or blocks): hundreds of data-path macros (30–75% chip area), thousands of small control logic cells (25–50% chip area), and some contain a few large macros such as memory array (0–30% chip area). It is not uncommon for the data-path logic to require more than one data-path stack in layout, e.g., see FIG. 1.

As noted, the present technique is directed to optimizing the physical ordering of macros within each data-path stack to be incorporated in a chip. Most, if not all, prior art block placement techniques (which typically operate in two-dimensions) fail to provide an optimal physical ordering of macros for a one-dimensional stack. Failure to optimize macro ordering can create significant problems for chip design. Each bit of a stack macro has a predefined number of physical wiring channels capable of accepting macro buses, i.e., predetermined physical connections between selected macros of the stack. To wire a stack within its physical boundaries requires that the number of buses wiring through each bit be less than or equal to the number of available wiring channels through the bit. As explained further herein, if a particular macro has an insufficient number of wiring channels per bit to accommodate another bus, then the bus must exit and thereafter re-enter the stack to wire around the congestion. In such a case, the stack grows by the equation:

2×NumNetsInBus×WidthInMicrons wherein:

NumNetsInBus=number of wires in the bus;

WidthInMicrons=width in microns of one wire in combination with a corresponding space between wires.

In addition, optimally decreasing the number of wiring channels per bit needed to accommodate the required bus interconnections provides a chip designer with flexibility to embed global wiring within the stack. In addition, if the required number of wiring channels is reduced, then each bit's width can be physically designed smaller resulting in an overall narrower stack width. Also, optimizing the order of stack macros shrinks the length of bus wires which correspondingly reduces the wiring capacitance thereby increasing chip performance.

Two processor based two-dimensional design techniques discussed in the open literature are CPLACE and MSMO, e.g., see Villarrubia et al., "IBM RISC Chip Design Methodology," IBM Advanced Workshop Division, ICCD-89 Conference, pp. 143–147; and Luk, "Multi-Terrain Partitioning and Floor-Planning for Data-Path Chip (Microprocessor) Layout," 26 ACM/IEEE Design Automation Conference, pp. 110–115, June 1989, respectively. CPLACE is a min-cut based placement program that utilizes ordered gain. This technique divides a stack of macros in half and then proceeds to redistribute macros between the two halves in an effort to minimize the number of connections therebetween. The process is continued until a minimum number of connections is found to cross each boundary. In MSMO processing, a number of potential terrain configurations are evaluated and the floor plan that provides the shortest length and smallest overflow in global wires, as well as meeting the timing and size requirements, is selected.

By way of comparative example, a main bit stack of 139 macros, 157 buses with 13,664 I/O connections was examined. Starting from a random order of stack macros, MSMO processing required 17 wiring channels per bit, while CPLACE needed 15 wiring channels per bit. Neither approach is believed to have produced an optimum, nor even an acceptable configuration (e.g., 12–14 wiring channels per bit). Time consuming manual redesign of the final MSMO or CPLACE generated bit stack configuration would be necessary to attain such an optimal ordering. This procedure is obviously cumbersome, particularly since during actual chip design the macros comprising a data-bit stack typically change numerous times before a final design is found acceptable. At each iteration it may be necessary for the chip designer to know specific characteristics of the proposed data-path stack, including the minimum number of wiring channels per bit required for internal wiring of the stack.

A genuine need thus exists in the semiconductor chip design art for an automated ordering technique capable of optimizing the physical order of stack macros to a greater extent than pre-existing techniques, and in a more efficient manner without the need for manual reordering of the stack to achieve an acceptable number of wiring channels per bit.

SUMMARY OF THE INVENTION

Briefly described, the present invention comprises certain novel automated methods for optimally physically ordering macros within a semiconductor chip stack. Each of the macros is assumed to have at least one predetermined bus connection with another macro in the stack. In one basic embodiment, the method comprises the automated steps of: selecting a macro within the stack for ordering; ordering the selected macro within the stack such that when considered together the buses predeterminedly connected to that macro pass a minimum number of other stack macros without connecting thereto; and repeating the selecting and ordering steps for all of the stack macros until no further macro ordering occurs.

More specifically, the step of ordering the selected macro may include iteratively moving the macro to different locations within the stack and determining at each iteration the total number of stack macros passed by buses predeterminedly connected to that macro. Further, the ordering step may include identifying the location within the stack where the buses predeterminedly connected to the macro pass a minimum number of stack macros without connecting thereto. Also described herein are specific guidelines for selecting the next stack macro to be ordered. Additional features of this method are also described and claimed herein.

In another basic embodiment, the invention includes the automated steps of: selecting a macro within the stack for ordering; optimally ordering the selected macro within the stack; repeating the selecting and ordering steps for a plurality of stack macros; forming a macro group of any subset of stack macros in a repeating loop over multiple applications of the selecting and ordering steps, the repetitive subset of macros containing at least two macros of the stack; treating a formed macro group as a single stack macro; repeating each of the above steps for the macros comprising the stack until no further macro ordering and/or macro grouping occurs; and ordering the macros within each formed macro group. The ordering of the macros within a macro group includes fixing the position of all macros outside the group and performing the above-outlined automated method steps for the macros contained within the macro group. In enhanced embodiment, the optimal ordering step includes ordering the selected macro within the stack such that taken together the buses predeterminedly connected to that macro pass a minimum number of other stack macros without connecting thereto. Numerous additional method features of this embodiment are also described and claimed herein.

The present inventive technique optimizes stack macro ordering to a greater extent then heretofore known processing techniques. The output order is independent of the beginning stack order (i.e., random or partially optimized) and automated execution of the technique is fast and efficient. The technique allows optimization of stack macro ordering substantially contemporaneous with imposed semiconductor design changes. By minimizing macro interconnecting bus lengths, the required number of wiring channels per bit is lowered, which may advantageously provide the opportunity for embedding global wiring within the stack.

BRIEF DESCRIPTION OF THE DRAWINGS

These and other objects, advantages and features of the present invention will be more readily understood from the following detailed description of certain preferred embodiments of the present invention, when considered in conjunction with the accompanying drawings in which.

DETAILED DESCRIPTION OF THE INVENTION

Figure 1:
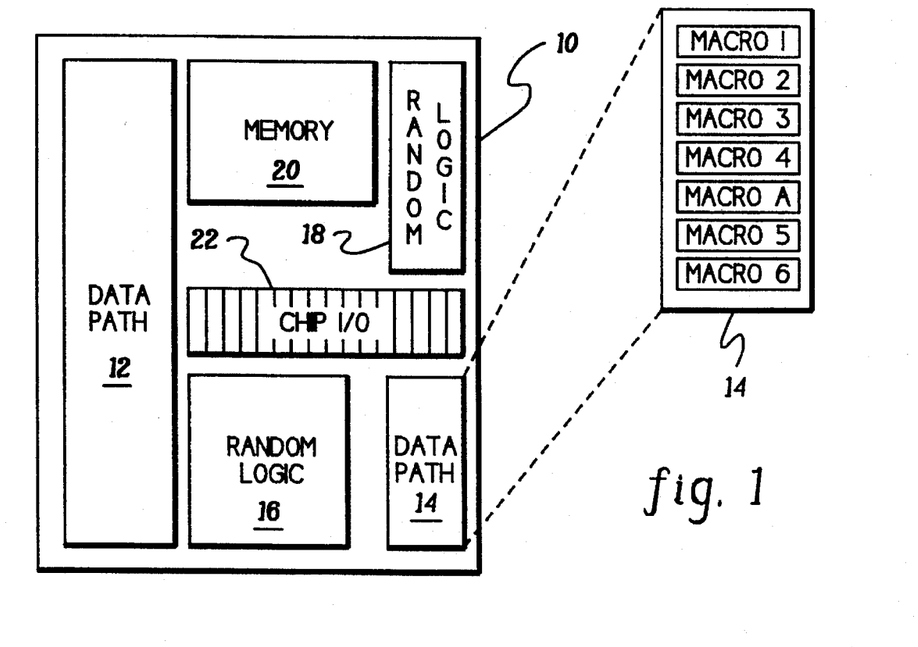
FIG. 1 is a block diagram representation of one embodiment of a microprocessor chip layout.

FIG. 1 depicts a floor plan of a multi-terrain microprocessor chip, generally denoted 10, with data-path logic stacks 12 & 14, control logic 16 & 18, memory 20 and off-chip drivers 22. As shown, data-path logic 14 comprises a vertical data stack having a plurality of predetermined interconnected data-path blocks or macros, labeled Macro 1, Macro 2, Macro 3, Macro 4, Macro A, Macro 5, and Macro 6. The data-path macros may include registers, adders, shifters, multiplexers, buffers, etc. Again, the present invention comprises a technique to optimize the ordering of each of these macros, e.g., Macro A, within the data-path stack.

Figure 2:
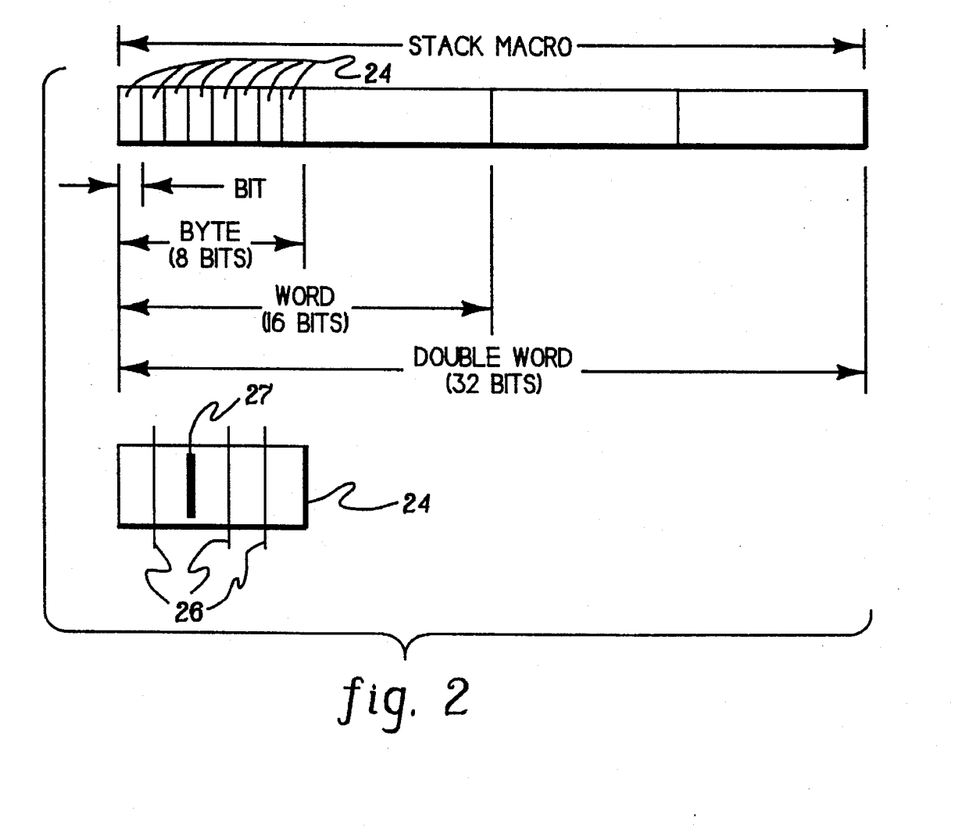
FIG. 2 is a block diagram representation of a stack macro, depicted in FIG. 1, and an enlarged representation of one bit of said macro.

By way of example, FIG. 2 depicts a stack macro which includes thirty-two bits 24. In this example, each bit has four possible wiring channels 26. One channel, channel 27, of the four channels is shown to be blocked. Often the chip layout will dictate that one (or more) wiring channel(s) in each bit of a data stack macro is (are) unavailable, e.g., because of internal wiring. If the maximum number of available channels (in this example three) is exceeded by the minimum number required to accommodate the predetermined bus connections between macros, then it is necessary to wire outside the stack.

Figure 3:
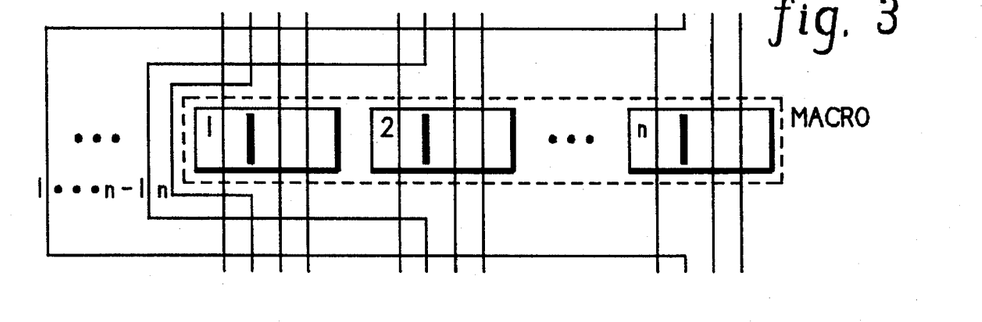
FIG. 3 is a schematic representation of bus wiring partially passing through and partially passing around one macro of a data-bit stack.

In the n bit macro depicted in FIG. 3, only three interconnecting macro buses are capable of passing through the four available bit wiring channels, again because one wiring channel is already in use. Thus, the stack must be "cracked" (i.e., wired outside) to provide for the necessary predetermined macro interconnections. Cracking a data-path stack to provide for macro interconnections necessarily increases chip fabrication complexity, along with stack dimensions, which typically increases chip size and therefore cost of chip manufacture. In practice, each bit contains more than four wiring channels, e.g., twelve to sixteen channels. However, as already noted, it remains desirable to ascertain the stack configuration which requires the fewest number of wiring channels per bit in order to reduce the size of the macro and, therefore, the macro stack, and thus the size of the chip. Further, the number of possible wiring channels per bit in a data-path stack is typically restricted by certain chip manufacturing ground rules; i.e., the number of wiring channels per bit is dependent on the technology used.

Figure 4A:
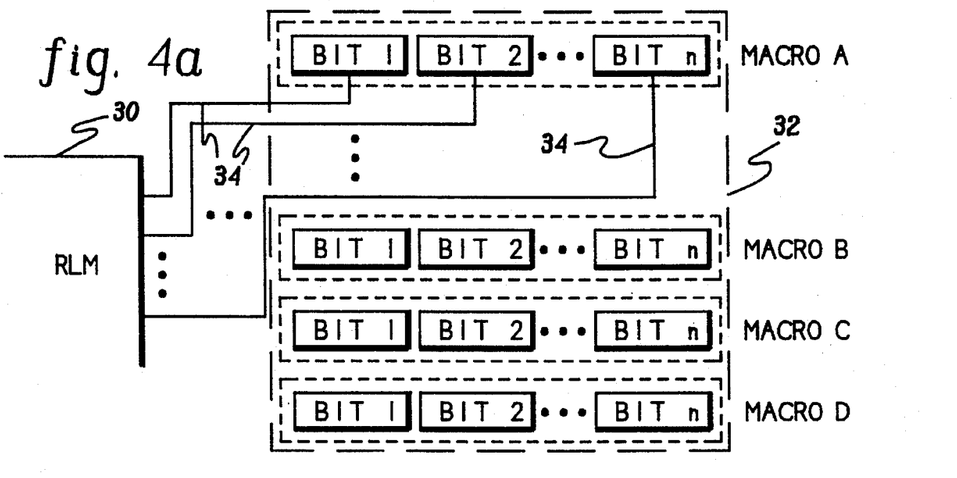
FIGS. 4a & 4b are schematic representations of two embodiments of global wiring between a stack Macro A and an external RLM.
Figure 4B:
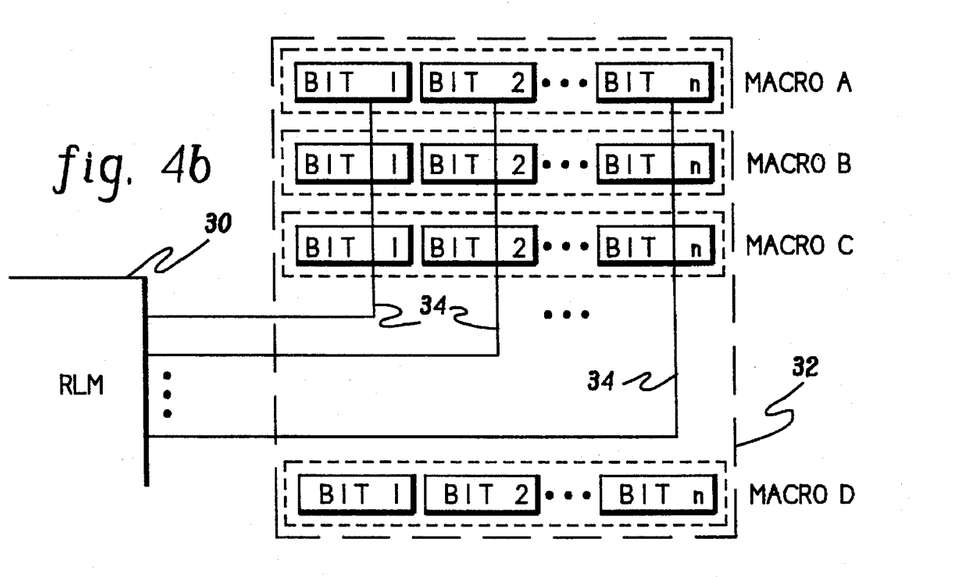

In addition, a significant design advantage is obtained where the number of wiring channels per bit required to accommodate the macro interconnecting buses is reduced below the maximum number available with existing technology. This allows a chip designer to reduce the overall chip dimensions even further by folding certain aspects of global wiring into the stack. Shown in FIG. 4a is a global connection between random logic memory (RLM) 30 and Macro A of a vertical data stack 32. In this embodiment there is presumed to be an insufficient number of wiring channels per bit to accommodate global wiring within the stack and, thus, the stack is cracked between Macro A and Macro B. As shown, a significant portion of wiring 34 may be located outside stack 32. The extent of global wiring may be significant in terms of increasing chip complexity and/or chip size. As shown in FIG. 4b, by freeing wiring channels within data-path stack 32, then the stack can be more efficiently cracked between Macro C and Macro D with global wiring 34 passing through available wiring channels in Macro B and Macro C, thereby reducing to a certain extent the amount of global wiring.

One embodiment of an optimizing technique pursuant to the present invention is described in detail below with reference to FIGS. 5a–9 hereof for a vertical data-path stack.

By way of an initial overview, the stack macro order optimizer of the present invention starts at the top of the order in a vertical stack and works down. Each macro is moved iteratively to a "best" position. The best position is defined as that location wherein the summation of the length of the buses which connect to that particular macro is minimized. When applied throughout the stack, the technique forces macros to pull each other together based on their interconnectivity. During this process, a subset of macros may fall into a repeating order or loop, which according to the invention is grouped together and treated as a single macro for further processing. By ignoring interconnections between macros within a group, the group is pulled to its optimum location in the current order. After optimizing the order in this manner, the macros comprising the group are then optimally ordered by fixing the locations of all macros outside the group and recursively calling the optimal ordering technique for processing of the macros within the group.

Figure 5A:
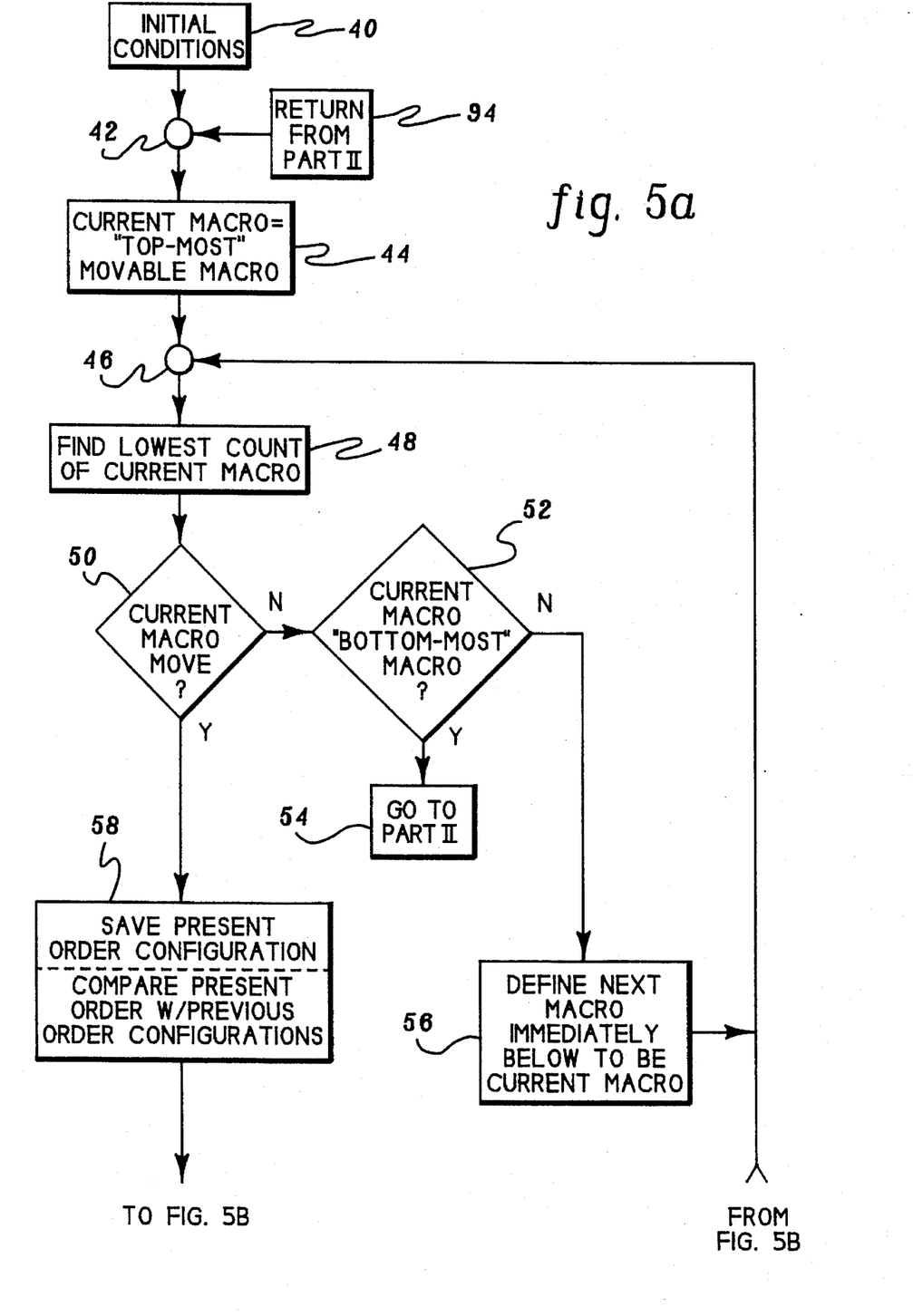
FIGS. 5a, 5b & 5c are a functional flowchart of one processing embodiment of a stack order optimizer pursuant to the present invention.
Figure 5B:
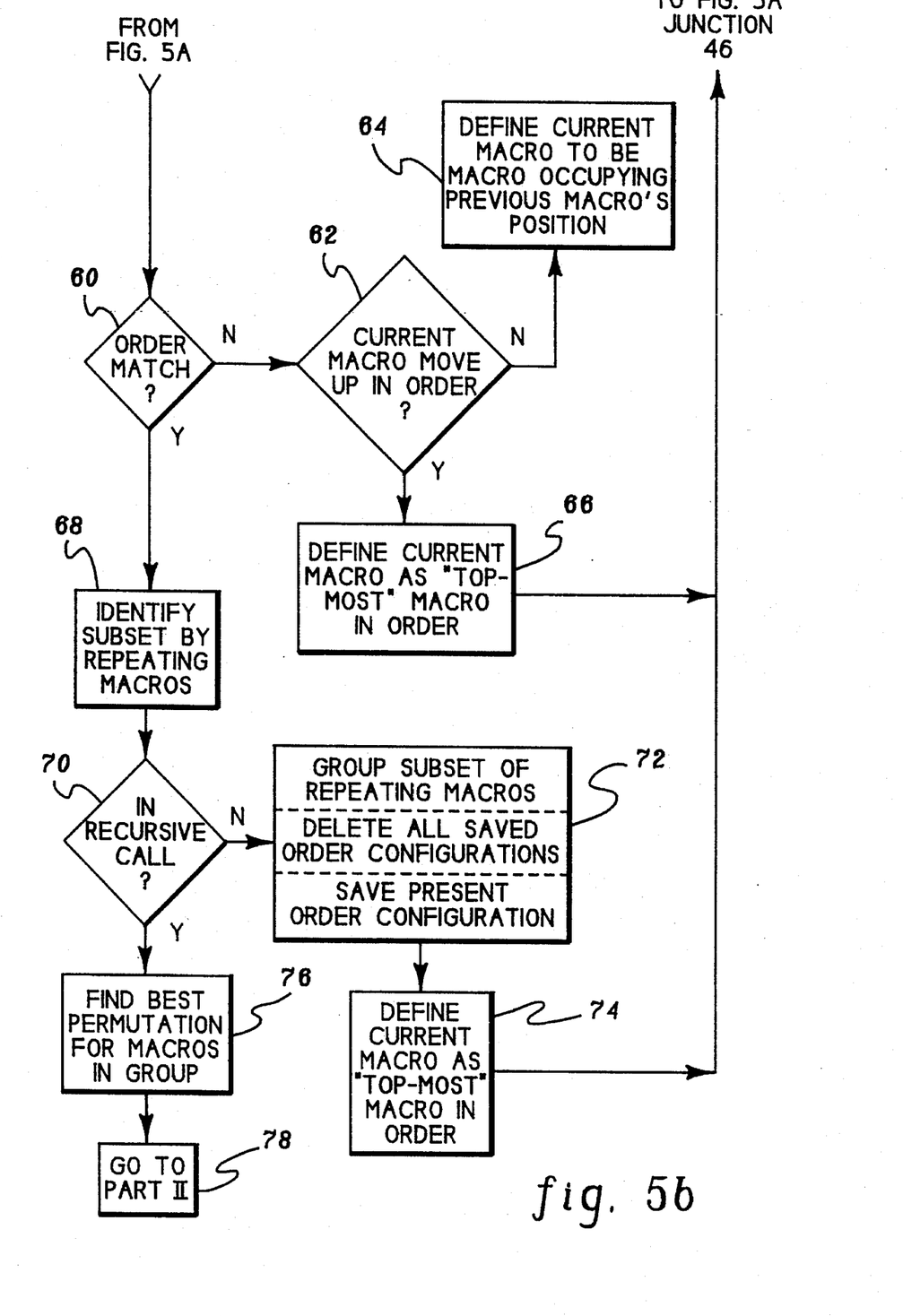
Figure 5C:
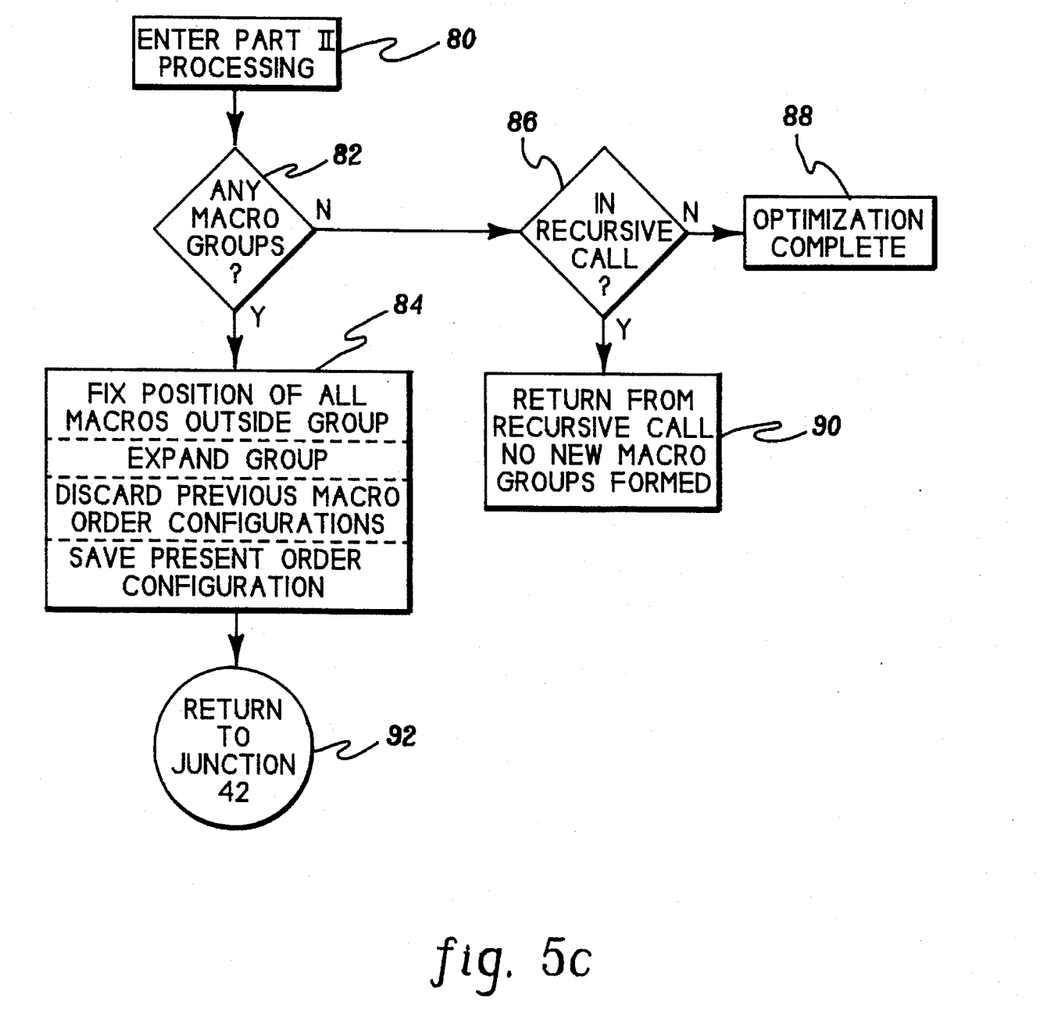

Referring specifically to FIGS. 5a–5c, one functional flowchart of an optimizing technique pursuant to the present invention is depicted. As shown in FIG. 5a, processing begins with certain initial conditions, 40 "Initial Conditions." The macros are in an initial configuration, which may be random or partially optimized. Each stack macro includes a list of buses that connect to it. By way of example, the processor may be provided with the following initial stack configuration and corresponding bus connections:

Macro B Bus 1, Bus 3

Macro C Bus 5

Macro A Bus 2, Bus 3, Bus 4

Macro D Bus 6, Bus 7

Macro E Bus 1, Bus 5, Bus 7

Macro F Bus 2, Bus 8

Macro G Bus 1, Bus 4, Bus 6, Bus 8.

(Again, bus connections are important to the present technique because when moving a macro the processor is directed to consider only those buses that connect to that particular macro.) Once initial conditions are defined, the processor, passing through junction 42, identifies the current macro for processing as that macro occupying the upper most position in the vertical stack configuration, 44 "Current Macro='Top-Most' Movable Macro." Thereafter the processor passes through junction 46 to instruction 48, "Find Smallest Count Of Current Macro."

Figure 6:
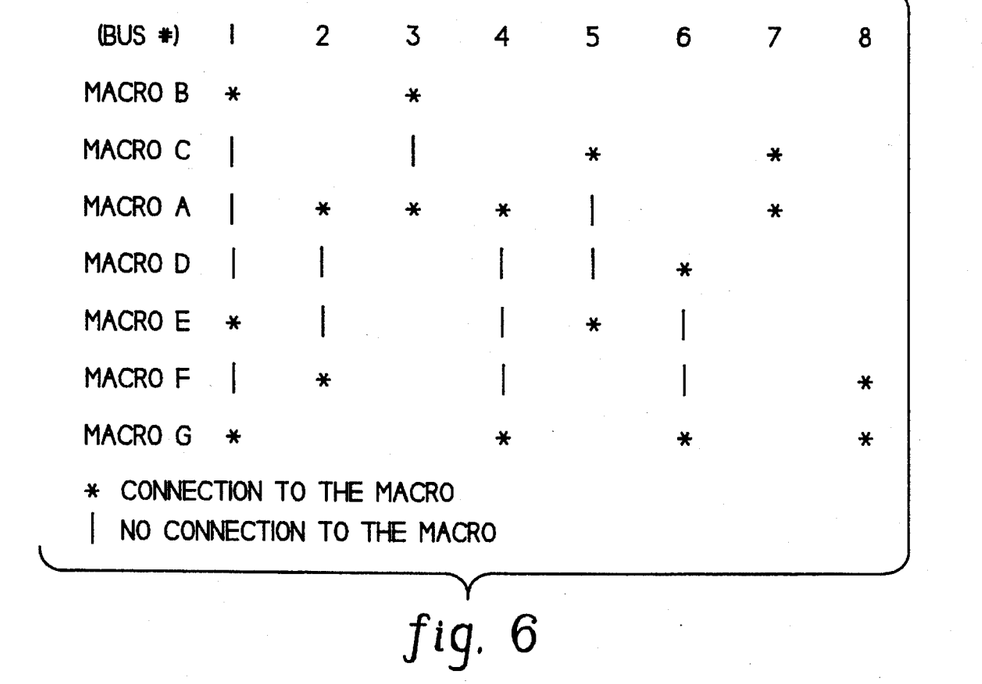
FIG. 6 depicts an example of bus connections between macros of a stack, which is useful in explaining the processing of FIGS. 5a–5c.

As used herein, a current macro location "count" equals the total number of macros within the stack through (or by) which the current macro's buses pass without connecting thereto. Referring to FIG. 6, Macro A is shown to have four buses connected to it, i.e., Bus 2, Bus 3, Bus 4 and Bus 7. In the depicted order location, Macro A has a six count since Bus 2 passes over two macros without connection, Bus 3 passes over one macro without connection, Bus 4 passes over three macros without connection, and Bus 7 passes over no macros without connection. As a further example, Macro E also has a six count in this configuration since Bus 1 passes four macros without connection and Bus 5 passes two macros without connection.

Figure 7:
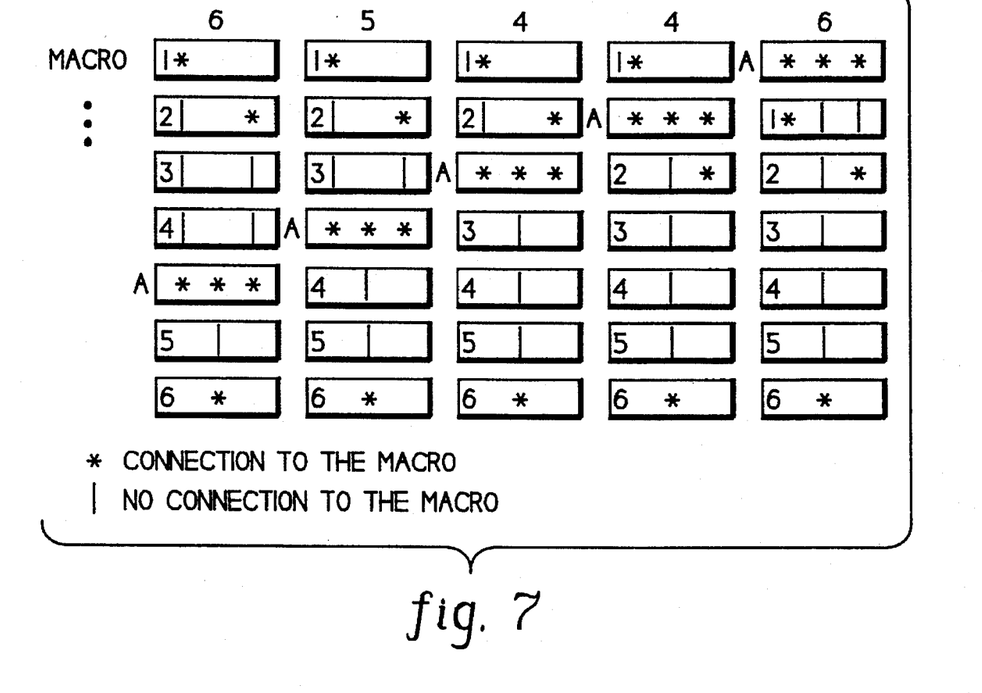
FIG. 7 shows an example of several various order configurations examined in identifying an optimal position for a selected macro (Macro A) pursuant to the present invention.

In the example shown in FIG. 7, Macro A is initially positioned between Macro 4 and Macro 5 (left most vertical stack). In this order, the three buses connected to Macro A produce a six count. By iteratively moving Macro A up in the order, the count decreases from six to five to four. As shown, a saddle is formed wherein Macro A has a lowest count (four) in two different locations, i.e., the second and third upper-most locations. Processing is discontinued once the count increases, as is the case with Macro A positioned at the upper-most location of the stack, where the count is six.

(As an alternative processing technique, the selected macro could have been optimally ordered, for example, pursuant to the CPLACE min-cut based placement program originally discussed herein.)

Returning to FIG. 5a, once the lowest count is established the processor determines whether the current macro was moved to find the lowest count, 50 "Current Macro Move?" If "no," inquiry is made whether the current macro comprises the bottom-most macro in the stack, 52 "Current Macro 'Bottom-Most' Macro?" If the answer is "yes," then the processor is directed to the Part II processing of FIG. 5c, which is discussed below. If the answer to inquiry 52 is "no," then the processor defines the next macro in the vertical stack, which preferably is the macro immediately below the just processed macro in the current order, 56 "Define Next Macro Immediately Below To Be Current Macro" (see Col. A, FIG. 9 wherein Macro A is the just processed Macro and Macro B is the next current Macro). Thereafter, return is made to junction 46, and hence instruction 48.

If the just processed macro did move in the order then the processor proceeds to identify whether any macros of the stack are in a repeating loop. Specifically, if the answer to inquiry 50 is "yes," then the processor saves the present order configuration and compares this new order configuration with all previously saved order configurations, 58 "Save Present Order Configuration; Compare Present Order Configuration With Previous Order Configurations." Thereafter, the processor determines whether there is a match in the saved order configurations, 60 "Order Match?" (FIG. 5b). Assuming that there is not, the processor inquires whether the just processed macro moved up in the order to obtain its lowest count, 62 "Current Macro Move Up In Order?" If "no," then the next current macro is defined as the macro now occupying the previous macro's position in the order before moving, 64 "Define Current Macro To Be Macro Occupying Previous Macro's Position" (see Col. B, FIG. 9). If the just processed macro has moved up in the order, then the new current macro is defined as the top-most macro in the vertical stack, 66 "Define Current Macro As 'Top-Most' Macro In Order" (see Col. C, FIG. 9). After defining the new current macro at instruction 64 or instruction 66, the processor returns to junction 46 and hence inquiry 48.

Figure 8:
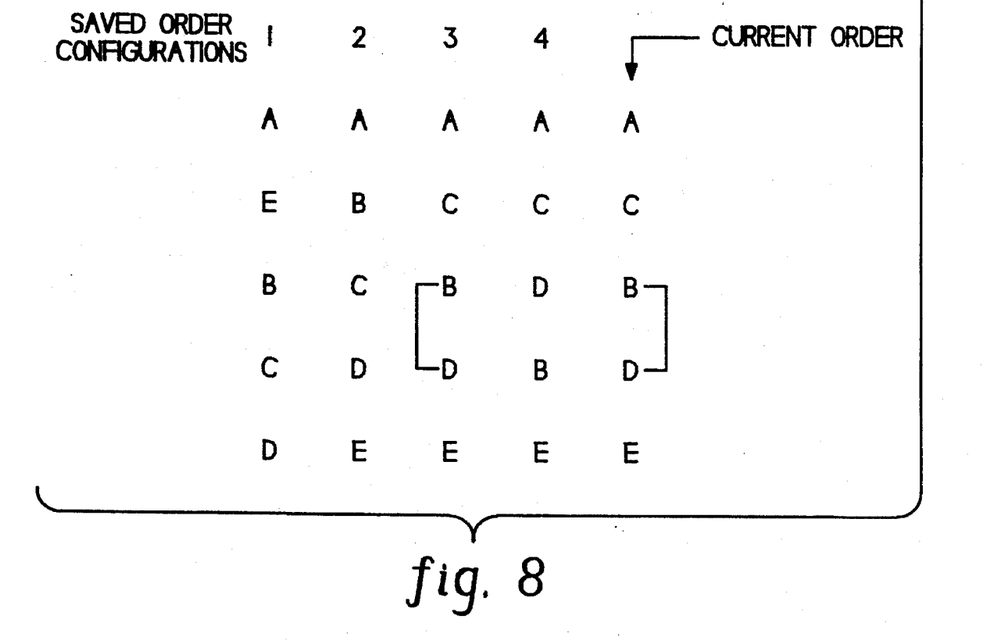
FIG. 8 is a chart of various saved order configurations useful in explaining the grouping concept pursuant to the present invention.
Figure 9:
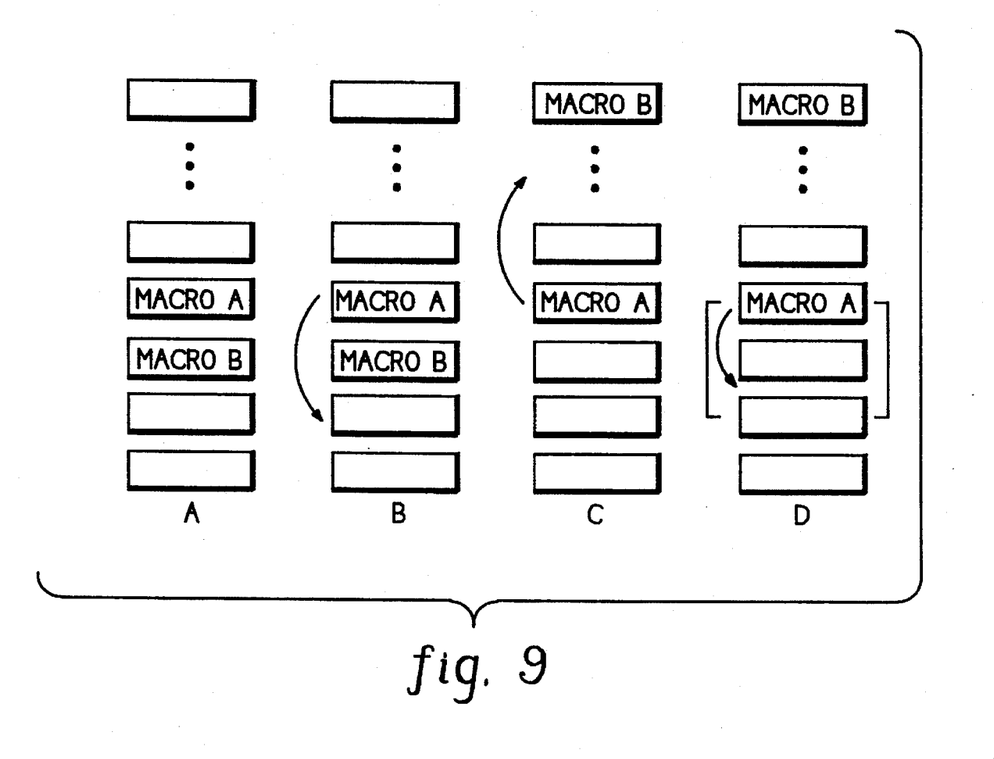
FIG. 9 is a chart depicting the various possible locations for the next selected macro (Macro B) to be processed pursuant to the present invention, i.e., subsequent processing of the current macro (Macro A).

Should a match in order configurations be found at inquiry 60, then the processor determines which macros in the order comprise the subset of repeating macros, 68 "Identify Subset Of Repeating Macros." A match of compared order configurations indicates that a subset of macros is caught in a repeating loop. The repetition is caused by the macros' interconnectivity. Once a match is established, the saved order configurations between the current order configuration and the saved order configuration which matches the current order is then examined and those macros which have moved between the two identical order configurations are found to comprise the macros in the loop, 68 "Identify Subset Of Repeating Macros." For example, FIG. 8 depicts a current order configuration and the four previous saved order configurations. The current order configuration is identical to the third saved order configuration and only Macro B and Macro D have moved between these identical configurations. Thus, a repeating subset comprising Macro B and Macro D is identified.

After identifying a repeating subset of macros, the processor inquires whether a recursive call (discussed below) is in process, 70 "In Recursive Call?" If "no," then the processor: forms a macro group of the subset of repeating macros; deletes all previously saved order configurations (since the stack now consists of a different combination of macros); and saves the present order configuration for future comparison, 72 "Group Subset Of Repeating Macros; Delete All Saved Order Configurations; Save Present Order Configuration." Thereafter, the processor defines the next current macro as the top-most macro in the order, 74 "Define Current Macro As 'Top-Most' Macro In Order," (see Col. D, FIG. 9) and returns to junction 46 and hence instruction 48 to determine the lowest count for this new current macro.

Returning to inquiry 70, if in a recursive call (i.e., the processor is optimally ordering the macros within a previously defined group), then the processor determines the best permutation for the macros in the group, 76 "Find Best Permutation For Macros In Group." This processing is needed because the group's position within the stack may have changed and/or the ordering of macros within the group when the loop was discovered may not necessarily be the optimal order. After finding the best permutation for a particular group under analysis, the processor returns to the Part II processing of FIG. 5c, 78 "Go To Part II."

Initially after entering part II processing, 80 "Enter Part II Processing," the processor inquires whether there are any macro groups or any additional macro groups left in the present order configuration, 82 "Any Macro Groups?" If "no," then the processor inquires whether it is in a recursive call, 86 "Recursive Call?" If the answer is again "no," then stack optimization is complete, 88 "Optimization Complete." If processing is in a recursive call, then return is made from the call with no new macro groups formed, 90 "Return From Recursive Call—No New Macro Groups Formed." In such a case, optimization of the group under recursive call is complete.

If the order contains macro groups, then the processor is directed to optimize each group by: fixing the position of all macros outside the particular group; expanding the macros within the group; discarding all previously saved macro order configurations; and saving the present order configuration, 84 "Fix Position Of All Macros Outside Group; Expand Group; Discard Previous Macro Order Configurations; Save Present Order Configuration." Thereafter, the processor returns, 94 "Return From Part II," to junction 42 and hence the macro order processing of FIGS. 5a & 5b. The recursion is repeated for to each group, 92 "RET. Junction 42." The order of recursive analysis of the formed groups is irrelevant.

Those skilled in the art will recognize that the automated processing techniques described herein can be readily implemented in any number of operating systems or languages. Further, the technique described herein provides fast and efficient ordering of stack macros and produces a better ordering of macros than heretofore known techniques. The output order is independent of the initial stack order and the technique allows optimization of stack macro ordering substantially contemporaneous with imposed stack design changes. Further, by minimizing interconnecting macro bus lengths the required number of wiring channels per bit is lowered, thereby providing the opportunity for embedding global wiring within the stack.

Although a specific embodiment of the present invention has been illustrated in the accompanying drawings and described in the foregoing detailed description, it will be understood that the invention is not limited to the particular embodiment described herein, but is capable of numerous rearrangements, modifications, and substitutions without departing from the scope of the invention. The following claims are intended to encompass all such modifications.

What is claimed is:

1. An automated method for optimally ordering macros within either a vertical or horizontal semiconductor chip stack, each of said macros having at least one predetermined bus connection with another macro in said stack, said method comprising the automated steps of:

(a) selecting a macro within said stack for ordering;

(b) optimally ordering said selected macro within said stack;

(c) repeating steps (a)–(b) for a plurality of stack macros;

(d) forming a macro group of any subset of stack macros caught in a repeating loop over multiple applications of said steps (a)–(b), said repetitive subset of macros containing at least two macros of said stack;

(e) treating a formed macro group as a single stack macro;

(f) repeating steps (a)–(e) for the macros comprising the stack until no further macro ordering and macro grouping occurs; and (g) ordering, subsequent said step (f), the macros within each macro group formed in said step (d), said ordering of macros within a macro group including the step of fixing the position of all macros outside said macro group and performing said steps (a)–(f) for the macros contained in said macro group.

2. The automated ordering method of claim 1, wherein said ordering step (b) includes ordering said selected macro within said stack such that when considered together the buses predeterminedly connected to said selected macro pass a minimum number of other stack macros without connecting thereto.

3. The automated ordering method of claim 2, wherein said ordering step (b) includes iteratively moving said selected macro to different locations within said stack and comparing at each iteration the total number of stack macros passed by buses predeterminedly connected to said macro.

4. The automated ordering method of claim 3, wherein said ordering step (b) includes identifying a location for said selected macro within said stack where buses predeterminedly connected to said selected macro pass a minimum number of stack macros without connecting thereto, and where multiple stack locations are identified for said selected macro as producing said minimum number and said location identifying step further includes selecting the stack location where said selected macro is farthest from its initial location when selected in step (a) for ordering pursuant to step (b).

5. The automated ordering method of claim 1, wherein said method further includes defining an initial macro stack order, said initial stack order having macros arranged in a random order or in a predetermined order.

6. The automated ordering method of claim 5, wherein said initial stack order includes a first macro at a first end of said stack and a last macro at a second end of said stack, and wherein the direction of macro processing pursuant to steps (a)–(g) is from said first end of said stack towards said second end of said stack and said method further includes initially selecting said first macro for ordering pursuant to step (b).

7. The automated ordering method of claim 6, wherein, subsequent to ordering of the first macro, said macro selecting step (a) includes selecting the macro in the direction of macro processing immediately adjacent the just ordered macro when the location of said just ordered macro within the stack remained unchanged.

8. The automated ordering method of claim 6, wherein, subsequent to ordering of the first macro, said macro selecting step (a) includes selecting the macro occupying the just ordered macro's original position in the stack before being ordered in said step (b) when said just ordered macro moved in the direction of macro processing to a new location within the stack.

9. The automated ordering method of claim 6, wherein, subsequent to ordering of the first macro and a second macro, said macro selecting step (a) includes selecting the macro positioned at said first end of said stack when the just ordered macro moved opposite the direction of macro processing to a new location within the stack.

10. The automated ordering method of claim 6, wherein, subsequent to ordering of the first macro and a second macro, said macro selecting step (a) includes selecting the macro located at the first end of the stack when a macro group is formed in step (d) after ordering the just ordered macro.

11. The automated ordering method of claim 6, wherein said stack comprises a vertical stack and said first end comprises the upper-most end such that the first selected macro comprises the top macro in said vertical stack.

12. The automated ordering method of claim 1, wherein said macro ordering step (b) includes saving the stack order subsequent to optimal ordering of said selected macro.

13. The automated ordering method of claim 12, wherein said macro group forming step (d) includes the steps of:

comparing for each ordered macro the current stack order with each saved stack order; and identifying as a result of said comparison any subset of stack macros in a repeating loop.

14. The automated ordering method of claim 13, wherein said identifying of step (d) includes identifying as a repeating subset of stack macros those macros which moved in location within the stack between the present stack order and an identical saved stack order.

15. The automated ordering method of claim 14, further comprising the step of deleting all saved stack orders subsequent to forming of a macro group.

16. The automated ordering method of claim 1, further comprising the steps of:

physically locating, subsequent to said steps (a)–(g), the ordered stack macros on said semiconductor chip; and physically making the predetermined bus interconnections between said physically located macros.

17. The automated processing method of claim 1, further comprising the step of cracking said optimally ordered stack and providing global wiring connections therein to at least one stack macro.

* * * * *